(12) United States Patent
Shiraishi et al.

(10) Patent No.: US 6,262,482 B1
(45) Date of Patent: *Jul. 17, 2001

(54) SEMICONDUCTOR DEVICE

(75) Inventors: Yasushi Shiraishi; Kazuhiko Sera; Etsuo Yamada; Kenji Nagasaki, all of Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/167,671

(22) Filed: Oct. 7, 1998

(30) Foreign Application Priority Data

Feb. 3, 1998 (JP) .................................................. 10-038145

(51) Int. Cl.[7] ...................................................... H01L 23/48
(52) U.S. Cl. ..................... 257/735; 257/696; 257/692; 257/687; 257/734; 257/736; 257/787
(58) Field of Search ................................. 257/734, 735, 257/736, 687, 692, 787, 696

(56) References Cited

U.S. PATENT DOCUMENTS

| 5,302,849 | * | 4/1994 | Cavasin | 257/666 |
| 5,840,599 | * | 11/1998 | Lamson et al. | 438/123 |

FOREIGN PATENT DOCUMENTS

| 52-19971 | * | 8/1975 | (JP) | 257/692 |
| 1-232753 | * | 9/1989 | (JP) | 257/692 |
| 08125066 |  | 5/1996 | (JP) . |  |
| 10189861 |  | 7/1998 | (JP) . |  |

* cited by examiner

Primary Examiner—Eddie C. Lee
Assistant Examiner—Matthew E. Warren
(74) Attorney, Agent, or Firm—Jones Volentine, L.L.C.

(57) ABSTRACT

In a semiconductor device 1 according to the present invention, a plurality of inner leads are bonded to a front surface of a semiconductor element 11 covered by a package 10, with bent portions 17 formed at some inner leads 13a among the plurality of inner leads 13 and the front ends of the bent portions 17 exposed at a front surface of the package 10. This structure ensures that the semiconductor element is not caused to move vertically inside the forming die by the pressure of the liquid resin or the like during the sealing process.

24 Claims, 9 Drawing Sheets

SEMICONDUCTOR DEVICE

BACKGROUND OF THE INVENTION

The present invention relates to a semiconductor device having a structure achieved by bonding inner leads to a semiconductor element internally provided at a package.

The memory capacities in semiconductor devices such as memory units have been increasing, as in 16 Mb DRAM and 64 Mb DRAM in recent years, which has resulted in an increase in the size of the semiconductor element (chip) which is internally provided at the package. At the same time, there is a need for miniaturization of semiconductor devices to facilitate high density mounting in electrical products, and thus, a large semiconductor element must be mounted in a small package. As a means for achieving this, LOC (Lead On Chip) semiconductor devices having a structure achieved by using double-sided adhesive tape to directly bond inner leads to a front surface of a semiconductor element and packaging this with resin have been proposed.

FIG. 17 is a plan view illustrating the internal structure of an LOC semiconductor device 100 in the prior art. FIG. 18 is a cross section along line D_D in FIG. 17. A plurality of inner leads 104 are bonded using a double-sided adhesive tape 103 having an insulating property at a front surface of a semiconductor element (chip) 102 covered by a package 101. The inner leads 104 are each electrically connected with an electrode pad 105 provided at the front surface of the semiconductor element 102 via a wire 106 such as a metal wire. In addition, the assembly is sealed (molded) with liquid resin inside a forming die in a state in which the inner leads 104 are bonded to the front surface of the semiconductor element 102 to achieve a structure having the semiconductor element 102 internally provided in the package 101. With the semiconductor device 100 having such an LOC structure, which does not require a die bat or the like for supporting the semiconductor element 102 unlike conventional packages, a relative increase can be achieved in the rate of the volume occupied by the semiconductor element 102 in the package 101 to realize miniaturization and high density mounting. Ultimately, with a semiconductor device 100 having the LOC structure, the ratio of the volume occupied by the semiconductor element 102 within the package 101 can be increased up to a maximum of approximately 90%.

However, in a semiconductor device having the LOC structure, the semiconductor element may be sometimes caused to move vertically within the forming die by the pressure of the liquid resin used for sealing and the like, resulting in the semiconductor element being placed at a position offset from the center inside the package. Such a misalignment of the semiconductor element is referred to as a chip shift. In the case of a semiconductor device having a so-called TSOP (Thin Small Outline Package) structure which employs a thin package, in particular, misalignment of the semiconductor element (chip shift) is problematic, since it may cause exposed wires and forming defects such as incomplete sealing of the package, which, in turn, will result in a reduction in the moisture resistance and the like.

SUMMARY OF THE INVENTION

Accordingly, an object of the present invention, which has been completed by addressing the problem of the semiconductor device in the prior art discussed above, is to provide a new and improved semiconductor device with which the pressure of the liquid resin or the like do not cause the semiconductor element to move vertically within the forming die during the sealing process.

Another object of the present invention is to provide a new and improved semiconductor device with which the semiconductor element can be internally provided at the center inside a package to eliminate problems such as exposed wires and forming defects, attributable to misalignment of the semiconductor element.

Yet another object of the present invention is to provide a new and improved semiconductor device with which exposed wire and forming defects attributable to misalignment of the semiconductor element can be prevented even in a semiconductor device employing a thin package such as, in particular, a semiconductor device with the TSOP structure.

In order to achieve the objects described above, in a first aspect of the present invention, a semiconductor device constituted by bonding a plurality of inner leads at a front surface of a semiconductor element covered by a package, which is characterized in that a bent portion is formed at some of the plurality of inner leads with the front end of the bent portion exposed at a front surface of the package, is provided.

In this semiconductor device, since the front ends of the bent portions formed at some of the inner leads are exposed at the front surface of the package, the semiconductor element can be prevented from moving toward the package front surface within the forming die by the bent portions even when the pressure of the liquid resin or the like is applied to the semiconductor element during the resin sealing process. Thus, this semiconductor device, in which the semiconductor element can be internally provided at the center of the package is free of problems such as exposed wire and forming defects caused by misalignment of the semiconductor element.

In addition, it is desirable that the inner leads at which the bent portions are formed not be electrically connected with the semiconductor element in the semiconductor device. This will ensure that the problem of an electrical signal erroneously input to the semiconductor element through the front ends of the bent portions exposed at the front surface of the package does not occur. Furthermore, the bent portions may each be formed by branching out from an inner lead that is not electrically connected with the semiconductor element. In this case, it is desirable that the inner leads having the bent portions be bonded to the front surface of the semiconductor element, since this will ensure that the bent portions are firmly secured to the front surface of the semiconductor element. Moreover, a supporting piece which is exposed parallel to the front surface of the package may extend at the front end of each bent portion. By providing such a supporting piece extending at the front end of the bent portion, the front surface of the supporting piece can be firmly placed in tight contact with the inner surface of the forming die during the resin sealing process so that the semiconductor element can be prevented from moving toward the package front surface within the forming die with a high degree of reliability. It is desirable that a double-sided adhesive tape be applied onto the front surface of the supporting piece in this case, since it will bond the front surface of the supporting piece to the inner surface of the forming die during the resin sealing process to prevent the semiconductor element from moving toward the package front surface within the forming die with an even higher degree of reliability.

In a second aspect of the present invention, a semiconductor device constituted by bonding a plurality of inner leads at a front surface of a semiconductor element covered by a package, which is characterized in that a bent portion is formed at some of the plurality of inner leads with the front end of the bent portion exposed at a first front surface of the package and in that each inner lead having the bent portion is bent within the package with the front end of the bent inner lead being exposed at a second front surface of the package is provided.

In this semiconductor device, in which the front ends of the bent portions formed at some of the inner leads are caused to be exposed at the first front surface of the package and the inner leads having the bent portions are bent with their front ends exposed at the second front surface of the package, the semiconductor element can be prevented from moving toward the first front surface of the package with the bent portions and the semiconductor element can also be prevented from moving toward the second front surface of the package with the bent inner leads within the forming die even when the pressure of the liquid resin or the like is applied to the semiconductor element during the resin sealing process. Thus, this semiconductor device, in which the semiconductor element can be internally provided at the center of the package is free of problems such as exposed wire and forming defects caused by misalignment of the semiconductor element.

It is desirable that the inner leads, at which the bent portions are formed not be electrically connected with the semiconductor element in the semiconductor device. This will ensure that the problem of an electrical signal erroneously input to the semiconductor element through the front ends of the bent portions exposed at the first front surface of the package or through the front ends of the bent inner leads exposed at the second front surface of the package, does not occur. Furthermore, the bent portions may each be formed by branching out from an inner lead that is not electrically connected with the semiconductor element. In this case, it is desirable that the base portions of the inner leads provided with the bent portions be bonded to the front surface of the semiconductor element, since this will ensure that the bent portions and the bent inner leads are firmly secured to the front surface of the semiconductor element. Moreover, a supporting piece which is exposed parallel to the first front surface of the package may extend at the front end of each bent portion. By providing such a supporting piece extending at the front end of the bent portion, the front surface of the supporting piece can be firmly placed in tight contact with the inner surface of the forming die during the resin sealing process so that the semiconductor element can be prevented from moving toward the package first front surface within the forming die with a high degree of reliability. It is desirable that a double-sided adhesive tape be applied onto the front surface of the supporting piece in this case, since it will bond the front surface of the supporting piece to the inner surface of the forming die during the resin sealing process to prevent the semiconductor element from moving toward the package first front surface within the forming die with an even higher degree of reliability.

In addition, as disclosed in claim 13, a supporting piece which is exposed parallel to the second front surface of the package may extend at the front end of each bent inner lead. By providing such a supporting piece extending at the front end of the bent inner lead, the front surface of the supporting piece can be firmly placed in tight contact with the inner surface of the forming die during the resin sealing process so that the semiconductor element can be prevented from moving toward the package second front surface within the forming die with a high degree of reliability. It is desirable that a double-sided adhesive tape be applied onto the front surface of the supporting piece in this case, since it will bond the front surface of the supporting piece to the inner surface of the forming die during the resin sealing process to prevent the semiconductor element from moving toward the package second front surface within the forming die with an even higher degree of reliability.

Furthermore, in a third aspect of the present invention, a semiconductor device constituted by bonding a plurality of inner leads at a front surface of a semiconductor element covered by a package, which is characterized in that some of the plurality of inner leads are bent within the package with the front ends of the bent inner leads exposed at a front surface of the package is provided.

In this semiconductor device, since some of the inner leads are bent within the package with the front ends of the bent inner leads exposed at the front surface of the package, the semiconductor element can be prevented from moving toward the package front surface within the forming die by the bent inner leads even when the pressure of the liquid resin or the like are applied to the semiconductor element during the resin sealing process. Thus, this semiconductor device, in which the semiconductor element can be internally provided at the center of the package, is free of problems such as exposed wire and forming defects caused by misalignment of the semiconductor element.

It is desirable that the bent inner leads not be electrically connected with the semiconductor element in the semiconductor device. This will ensure that the problem of an electrical signal erroneously input to the semiconductor element through the front ends of the bent inner leads exposed at the front surface of the package does not occur. In addition, it is desirable that the base portions of the bent inner leads be bonded to the front surface of the semiconductor element, since this will ensure that the bent inner leads are firmly secured to the front surface of the semiconductor element. Moreover, a supporting piece which is exposed parallel to the surface of the front surface of the package may extend at the front end of each bent inner lead. By providing such a supporting piece extending at the front end of the bent inner lead, the front surface of the supporting piece can be firmly placed in tight contact with the inner surface of the forming die during the resin sealing process so that the semiconductor element can be prevented from moving toward the package front surface within the forming die with a high degree of reliability. It is desirable that a double-sided adhesive tape be applied onto the front surface of the supporting piece in this case, since it will bond the front surface of the supporting piece to the inner surface of the forming die during the resin sealing process to prevent the semiconductor element from moving toward the package front surface within the forming die with an even higher degree of reliability.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The preferred embodiments of the present invention are now explained by referring to the attached drawings. It is to be noted that in the following explanation and the attached drawings, the same reference numbers are assigned to members having almost identical functions and structures to preclude the necessity for repeated explanation thereof.

Figure 1:
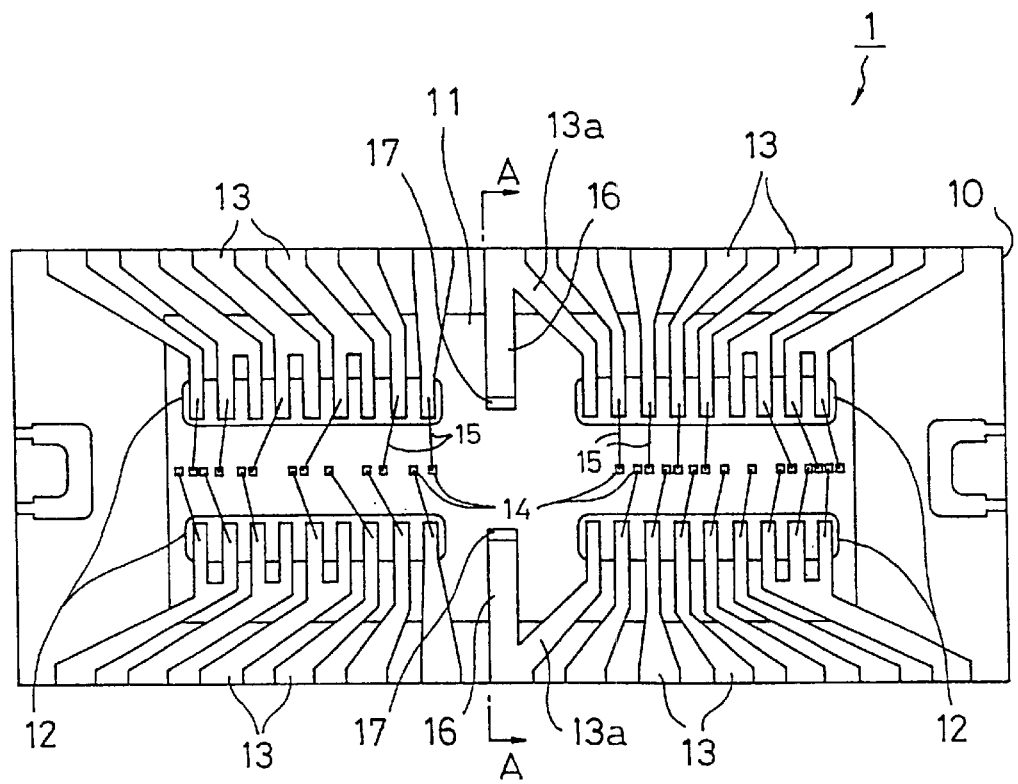
FIG. 1 is a plan view illustrating the inner structure of the semiconductor device in the first embodiment of the present invention.
Figure 2:
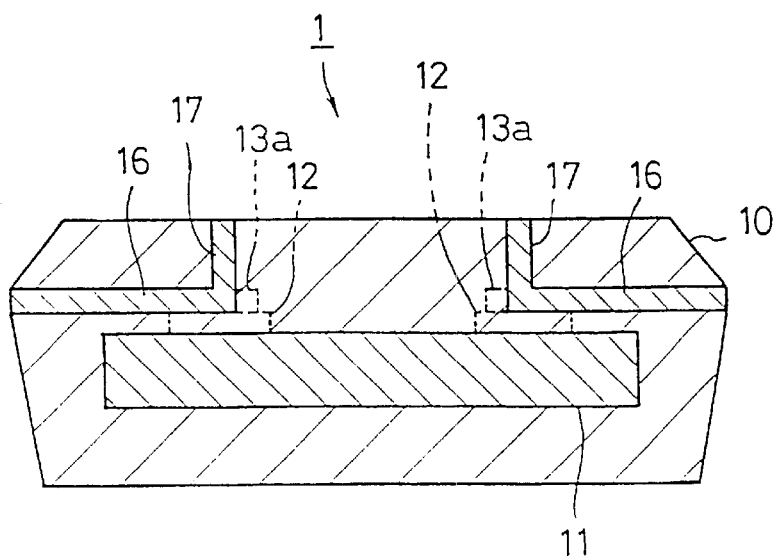
FIG. 2 is a cross section along line A—A in FIG. 1.

FIG. 1 is a plan view illustrating the internal structure of a semiconductor device 1 in the first embodiment of the present invention and FIG. 2 is a cross section along line A—A in FIG. 1. At a front surface of a semiconductor element (chip) 11 covered by a package 10, a plurality of inner leads 13 are bonded using a double-sided adhesive tape 12 constituted by using a material having an insulating property, such as polyimide. Except for some inner leads 13a, the inner leads 13 are each electrically connected with an electrode pad 14 provided at the front surface of the semiconductor element 11 via a wire 15 such as a metal wire. The wires 15 are connected by, for instance, thermally crimping the front ends of the wires 15 with ultrasonic waves to the individual inner leads 13 and the individual electrode pads 14. It is to be noted that the inner leads 13a that are not electrically connected with an electrode pad 14 are frequently referred to as non-connect pins. As in the case of the other inner leads 13, the inner leads 13a that are not electrically connected with an electrode pad 14, too, are bonded to the front surface of the semiconductor element 11 using the double-sided adhesive tape 12.

In the first embodiment, a branch portion 16 is formed by branching out from each of the inner leads 13a located at approximately the center of the plurality of inner leads 13 that are not electrically connected with an electrode pad 14. In addition, a bent portion 17 is formed by bending the branch portion 16 upward almost vertically inside the package 10. As illustrated in FIG. 2, the front ends of the bent portions 17 are exposed at a front surface of the package (the upper surface of the package 10 in the example illustrated in the figure).

The semiconductor device 1 in the first embodiment is manufactured in a manner identical to that for manufacturing a regular resin-sealed semiconductor device having the LOC structure. Namely, first, as illustrated in FIGS. 1 and 2, the inner leads 13 and 13a are bonded at the front surface of the semiconductor element 11 using the double-sided adhesive tape 12, and the semiconductor element 11 is placed at approximately the center within a forming die (not shown) with the individual inner leads 13 electrically connected to the electrode pads 14 via the wires 15. Then, by forcing liquid resin into the forming die and hardening the resin, the semiconductor element 11 is internally mounted within the package 10.

During this manufacturing process, when resin sealing the assembly by forcing the liquid resin into the forming die, the pressure of the liquid resin or the like are bound to be applied to the semiconductor element 11. However, in the semiconductor device 1 in the first embodiment having the bent portions 17 formed by almost vertically bending the branch portions 16 branching out from the inner leads 13a that are not electrically connected with an electrode pad 14, inside the package 10, with the front ends of the bent portions 17 exposed at the front surface of the package 10, as explained earlier in reference to FIGS. 1 and 2, the front ends of the bent portions 17 come into contact with the inner surface of the forming die when the semiconductor element 11 is placed inside the forming die. Thus, even when the pressure of the liquid resin or the like is applied to the semiconductor element 11 during the resin sealing process, the semiconductor element 11 can be prevented from moving toward the front surface of the package 10 inside the forming die by the bent portions 17. As a result, the semiconductor device 1 in the first embodiment, in which the semiconductor element 11 can be internally mounted at the center of the package 10, is free of problems such as the wires 15 becoming exposed and forming defects that are attributable to misalignment of the semiconductor element 11.

In addition, in the semiconductor device 1 in the first embodiment, since the inner leads 13a having the bent portions 17 are not electrically connected with any of the electrode pads 14 at the front surface of the semiconductor element 11, the problem of an electrical signal erroneously input to the semiconductor element 11 through the front ends of the bent portions 17 exposed at the front surface of the package 10 is eliminated. Furthermore, as explained earlier, since the inner leads 13a having the bent portions 17, too, are bonded to the front surface of the semiconductor element 11 using the double-sided adhesive tape 12, the bent portions 17 can be firmly secured to the front surface of the semiconductor element 11 so that the front ends of the bent portions 17 can be placed into contact with the inner surface of the forming die when the semiconductor element 11 is mounted inside the forming die.

Figure 3:
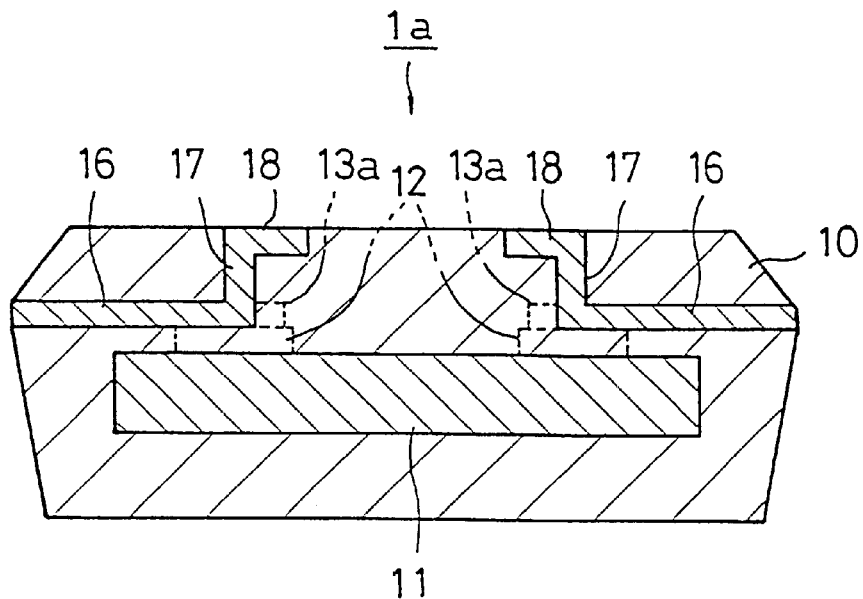
FIG. 3 is a cross section illustrating the internal structure of the semiconductor device in an example of a variation of the first embodiment of the present invention.

FIG. 3 is a cross section illustrating the internal structure of a semiconductor device 1a in an example of a variation of the first embodiment of the present invention. It is to be noted that the position and the direction of the cross section are the same as those in FIG. 2. In this semiconductor device 1a, supporting pieces 18 are exposed parallel to the front surface of the package 10 at the front ends of each bent portions 17. It is to be noted that since the semiconductor device 1a illustrated in FIG. 3 has a structure identical to that of the semiconductor device 1 explained earlier in reference to FIGS. 1 and 2 except for the supporting pieces 18 extending at the front ends of the bent portions, the same reference numbers are assigned to components in FIG. 3 that are structurally identical to those in the semiconductor device 1 explained earlier in reference to FIGS. 1 and 2 to preclude the necessity for repeated explanation thereof.

In this semiconductor device 1a, in which the supporting pieces 18 are provided extending at the front ends of the bent portions 17, the front surfaces of the supporting pieces 18 are firmly placed in tight contact with the inner surface of the forming die during the resin sealing process to increase the contact area. Thus, the bent portions 17 are held fast to the inner surface of the forming die during the resin sealing process to achieve an advantage in that the semiconductor element 11 is prevented from moving toward the front surface of the package 10 with a high degree of reliability.

Figure 4:
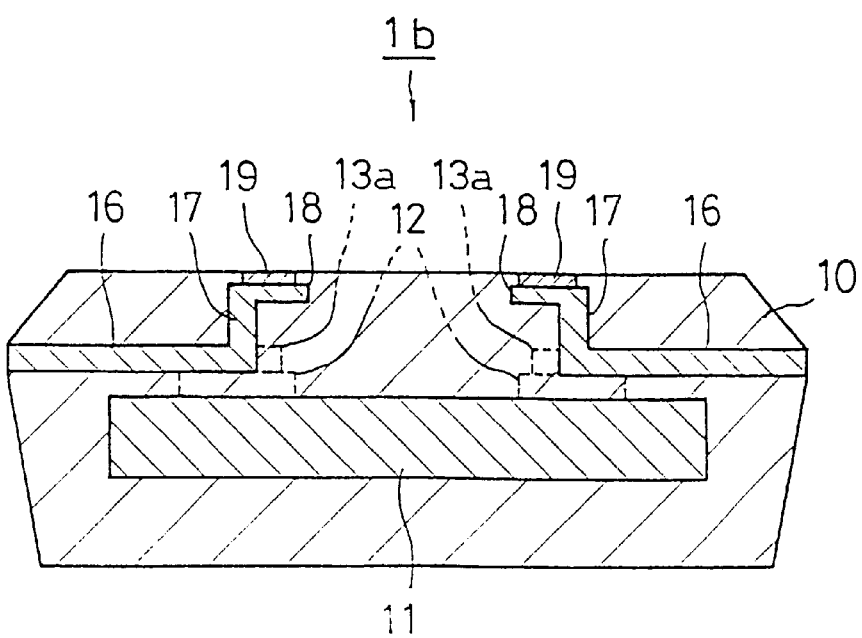
FIG. 4 is a cross section illustrating the internal structure of the semiconductor device in another example of a variation of the first embodiment of the present invention.

In addition, FIG. 4 is a cross section illustrating the internal structure of a semiconductor device 1b in another example of a variation of the first embodiment of the present invention. It is to be noted that the position and the direction of the cross section are the same as those in FIG. 2. In this semiconductor device 1b, a double-sided adhesive tape 19 constituted of a material having an insulating property such as polyimide is applied onto the front surfaces of the supporting pieces 18 which extend at the front ends of the bent portions 17 as in the semiconductor device 1a explained earlier in reference to FIG. 3. It is also to be noted that since the semiconductor device 1b illustrated in FIG. 4 has a structure identical to that of the semiconductor device 1 explained earlier in reference to FIGS. 1 and 2 except for the supporting pieces 18 onto which the double-sided tape is applied, the same reference numbers are assigned to components in FIG. 4 that are structurally identical to those in the semiconductor device 1 explained earlier in reference to FIGS. 1 and 2 to preclude the necessity for repeated explanation thereof.

In this semiconductor device 1b having the double-sided adhesive tape 19 applied onto the supporting pieces 18, the front surfaces of the supporting pieces 18 are firmly bonded at the inner surface of the forming die with the double-sided adhesive tape 19 during the resin sealing process. Thus, an advantage is achieved in that the semiconductor element 11 is prevented from moving toward the front surface of the package 10 during the resin sealing process with an even higher degree of reliability. In addition, by using a material with an insulating property such as polyimide to constitute the double-sided adhesive tape 19, an added advantage is achieved in that the front ends of the bent portions 17 exposed at the front surface of the package 10 and the supporting pieces 18 can be insulated.

Figure 5:
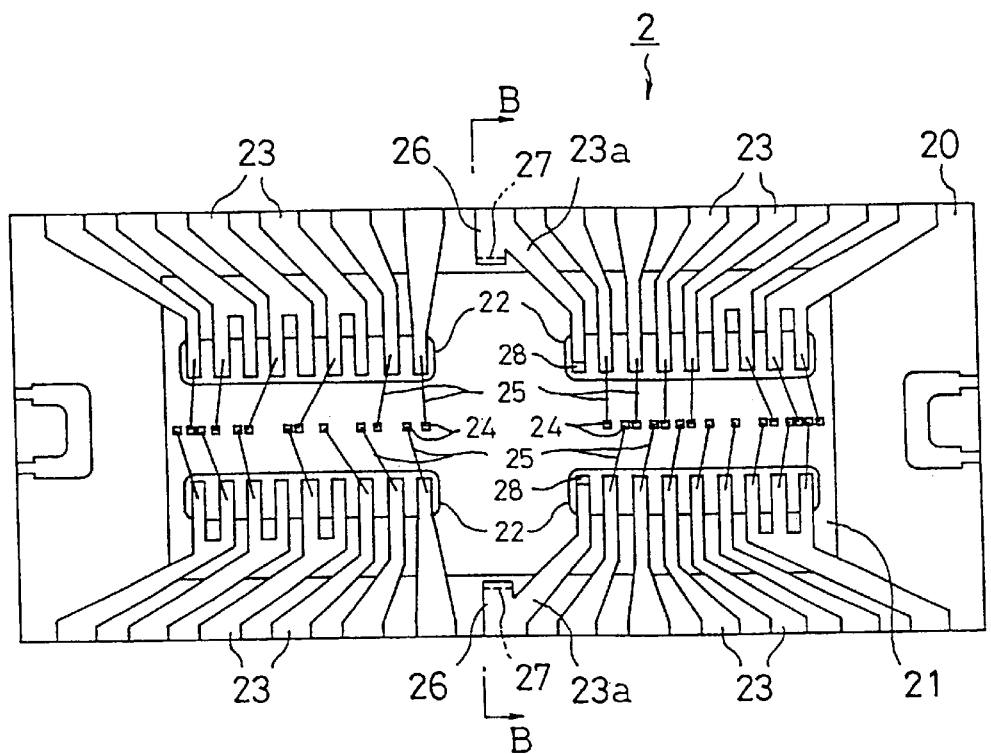
FIG. 5 is a plan view illustrating the inner structure of the semiconductor device in the second embodiment of the present invention.
Figure 6:
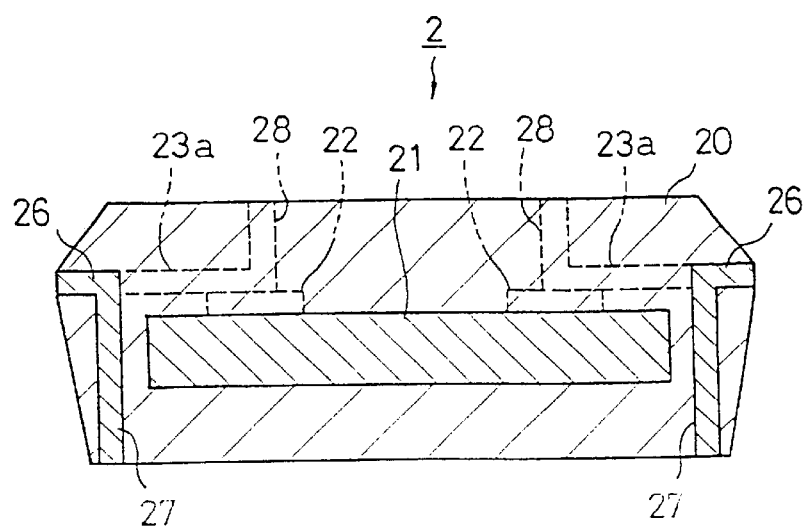
FIG. 6 is a cross section along line B—B in FIG. 5.

FIG. 5 is a plan view illustrating the internal structure of a semiconductor device 2 in the second embodiment of the present invention and FIG. 6 is a cross section along line B—B in FIG. 5. As in the first embodiment of the present invention explained earlier at a front surface of a semiconductor element (chip) 21 covered by a package 20, a plurality of inner leads 23 are bonded using a double-sided adhesive tape 22 constituted by using a material having an insulating property, such as polyimide. Except for some inner leads 23a, the inner leads 23 are each electrically connected with an electrode pad 24 provided at the front surface of the semiconductor element 21 via a wire 25 such as a metal wire. As in the case of the other inner leads 23, the inner leads 23a (non-connect pins), too, that are not electrically connected with an electrode pad 24, are bonded to the front surface of the semiconductor element 21 with the double-sided adhesive tape 22 at their base portions (the portions in the individual inner leads 23a that do not constitute bent portions 28, which are to be detailed later.

In the second embodiment, a branch portion 26 is formed by branching out from each of the inner leads 23a located at approximately the center of the plurality of inner leads 23 that are not electrically connected with an electrode pad 24. By bending downward the branch portion 26 almost vertically inside the package 20, a first bent portion 27 is formed. As illustrated in FIG. 6, the front end of the first bent portion 27 is exposed at a first front surface of the package 20 (the lower surface in the example illustrated in the figure). In addition, a second bent portion 28 is formed by bending upward almost vertically the inner lead 23a itself at which the first bent portion 27 is formed by branching out within the package 20. Moreover, as illustrated in FIG. 6, the front ends of the second bent portions 28 formed by bending the inner leads 23a are exposed at a second front surface of the package 20 (the upper surface in the example illustrated in the figure) on the opposite side from the first front surface.

The semiconductor device 2 in the second embodiment, too, is manufactured in a manner identical to that for manufacturing a regular resin-sealed semiconductor device having the LOC structure. Namely, first, as illustrated in FIGS. 5 and 6, the inner leads 23 and 23a are bonded at the front surface of the semiconductor element 21 using the double-sided adhesive tape 22, and the semiconductor element 21 is placed at approximately the center within a forming die (not shown) with the individual inner leads 23 electrically connected to the electrode pads 24 via the wire 25. Then, by forcing a liquid resin into the forming die and hardening the resin, the semiconductor element 21 is internally mounted within the package 20.

During this manufacturing process, when resin sealing the assembly by forcing the liquid resin into the forming die, the pressure of the liquid resin or the like are bound to be applied to the semiconductor element 21. However, in the semiconductor device 2 in the second embodiment having the first bent portions 27 formed by almost vertically bending downward the branch portions 26 formed by branching out from the inner leads 23a that are not electrically connected with an electrode pad 24 inside the package 20 with the front ends of the first bent portions 27 exposed at the first front surface of the package 20 (the lower surface in the example illustrated in the figure), as explained earlier in reference to FIGS. 5 and 6, the front ends of the first bent portions 27 come into contact with the inner surface of the forming die (the lower surface of the forming die in the example illustrated in the figure) when the semiconductor element 21 is placed inside the forming die. In addition, since the second bent portions 28 are each formed by bending upward almost vertically an inner lead 23a itself having the first bent portion 27 formed by branching inside the package with the front ends of the second bent portions 28 exposed at the second surface of the package 20 (the upper surface in the example illustrated in the figure), the front ends of the second bent portions 28 are placed in contact with the inner surface of the forming die (the upper surface of the forming die in the example illustrated in the figure) when the semiconductor element 21 is mounted inside the forming die.

Thus, even when the pressure of the liquid resin or the like is applied to the semiconductor element 21 during the resin sealing process, the semiconductor element 21 is prevented from moving toward the first front surface of the package 20 by the first bent portions 27 and is also prevented from moving toward the second front surface of the package 20 by the second bent portions 28 within the forming die. Consequently, the semiconductor device 2 in the second embodiment, in which the semiconductor element 21 can be internally mounted at the center of the package 20, is free of problems such as the wires 25 becoming exposed and forming defects that are attributable to misalignment of the semiconductor element 21.

In addition, in the semiconductor device 2 in the second embodiment, too, since the inner leads 23a having the first bent portions 27 and the second bent portions 28 are not electrically connected with any of the electrode pads 24 at the front surface of the semiconductor element 21, the problem of an electrical signal erroneously input to the semiconductor element 21 through the front ends of the first bent portions 27 exposed at the first front surface of the package 20 or through the front ends of the second bent portions 28 exposed at the second front surface of the package 20 is eliminated. Furthermore, as explained earlier, since the inner leads 23a having the bent portions 27, too, are bonded to the front surface of the semiconductor element 21 using the double-sided adhesive tape 22, the first bent portions 27 and the second bent portions 28 can be firmly secured to the front surface of the semiconductor element 21 so that the front ends of the first bent portions 27 and the front ends of the second bent portions 28 can be firmly placed into contact with the inner surface of the forming die when the semiconductor element 21 is mounted inside the forming die.

Figure 7:
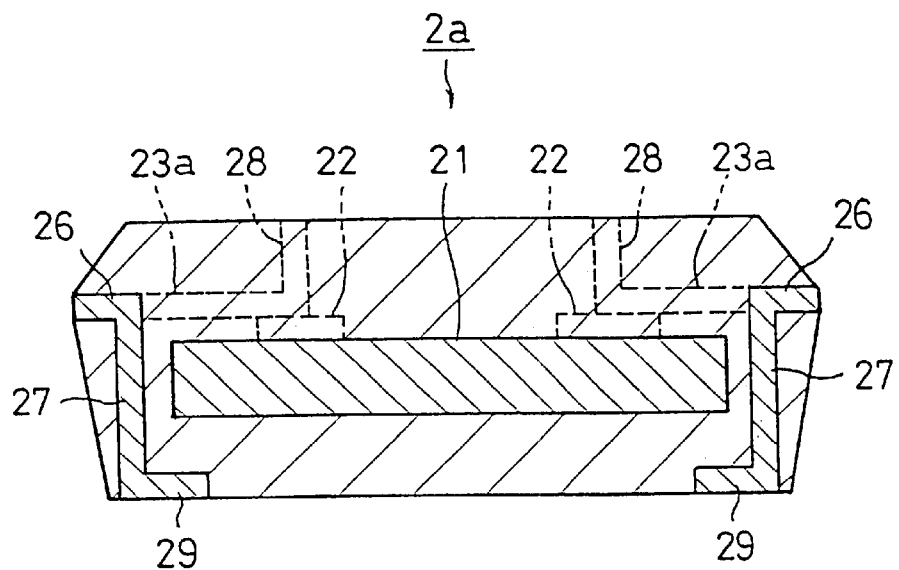
FIG. 7 is a cross section illustrating the internal structure of the semiconductor device in an example of a variation of the second embodiment of the present invention.

FIG. 7 is a cross section illustrating the internal structure of a semiconductor device 2a in an example of a variation of the second embodiment of the present invention. It is to be noted that the position and the direction of the cross section are the same as those in FIG. 6. In this semiconductor device 2a, a supporting piece 29 which is exposed parallel to the first surface of the package 20, extends at the front end of each first bent portion 27. It is to be noted that since the semiconductor device 2a illustrated in FIG. 7 has a structure identical to that of the semiconductor device 2 explained earlier in reference to FIGS. 5 and 6 except for the supporting pieces 29 extending at the front ends of the first bent portions, the same reference numbers are assigned to components in FIG. 7 that are structurally identical to those in the semiconductor device 2 explained earlier in reference to FIGS. 5 and 6 to preclude the necessity for repeated explanation thereof.

In this semiconductor device 2a, in which the supporting pieces 29 are provided extending at the front ends of the first bent portions 27, the front surfaces of the supporting pieces 29 are firmly placed in tight contact with the inner surface of the forming die during the resin sealing process to increase the contact area. Thus, the first bent portion 27 are held fast to the inner surface of the forming die during the resin sealing process to achieve an advantage in that the semiconductor element 21 is prevented from moving toward the first front surface of the package 20 (toward the lower surface in the example illustrated in the figure) with a high degree of reliability.

Figure 8:
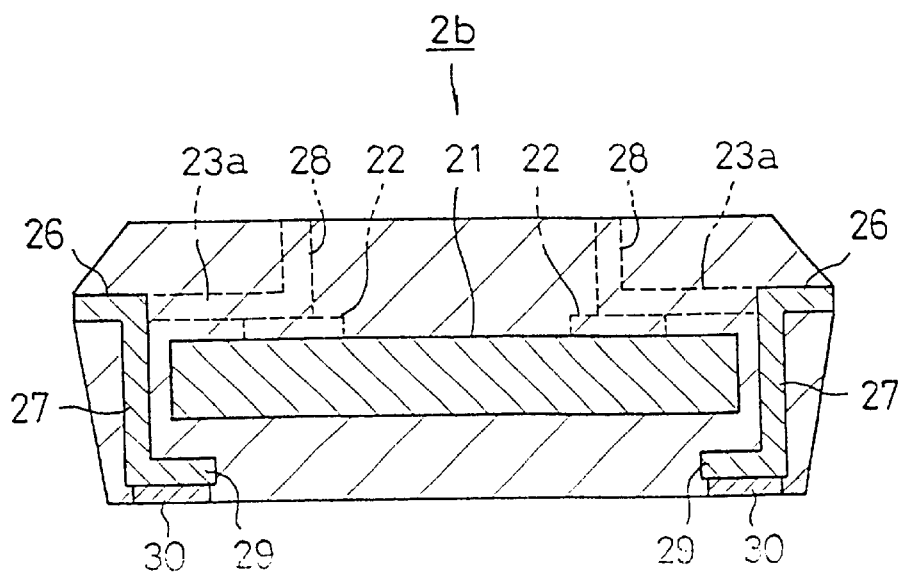
FIG. 8 is a cross section illustrating the internal structure of the semiconductor device in another example of a variation of the second embodiment of the present invention.

In addition, FIG. 8 is a cross section illustrating the internal structure of a semiconductor device 2b in another example of a variation of the second embodiment of the present invention. It is to be noted that the position and the direction of the cross section are the same as those in FIG. 6. In this semiconductor device 2b, a double-sided adhesive tape 30 constituted of a material having an insulating property such as polyimide is applied onto the front surfaces of the supporting pieces 29 which extend at the front ends of the first bent portions 27 as in the semiconductor device 2a explained earlier in reference to FIG. 7. It is to be also noted that since the semiconductor device 2b illustrated in FIG. 8 has a structure identical to that of the semiconductor device 2 explained earlier in reference to FIGS. 5 and 6 except for the supporting pieces 29 onto which the double-sided adhesive tape 30 is applied, the same reference numbers are assigned to components in FIG. 8 that are structurally identical to those in the semiconductor device 2 explained earlier in reference to FIGS. 5 and 6 to preclude the necessity for repeated explanation thereof.

In this semiconductor device 2b having the double-sided adhesive tape 30 applied onto the supporting pieces 29, the front surfaces of the supporting pieces 29 are firmly bonded at the inner surface of the forming die with the double-sided adhesive tape 30 during the resin sealing process. Thus, an advantage is achieved in that the semiconductor element 21 is prevented from moving toward the first front surface of the package 20 (toward the lower surface in the example illustrated in the figure) with an even higher degree of reliability during the resin sealing process. In addition, by using a material with an insulating property such as polyimide to constitute the double-sided adhesive tape 30, an added advantage is achieved in that the front ends of the bent portions 27 exposed at the front surface of the package 20 and the supporting pieces 29 can be insulated.

Figure 9:
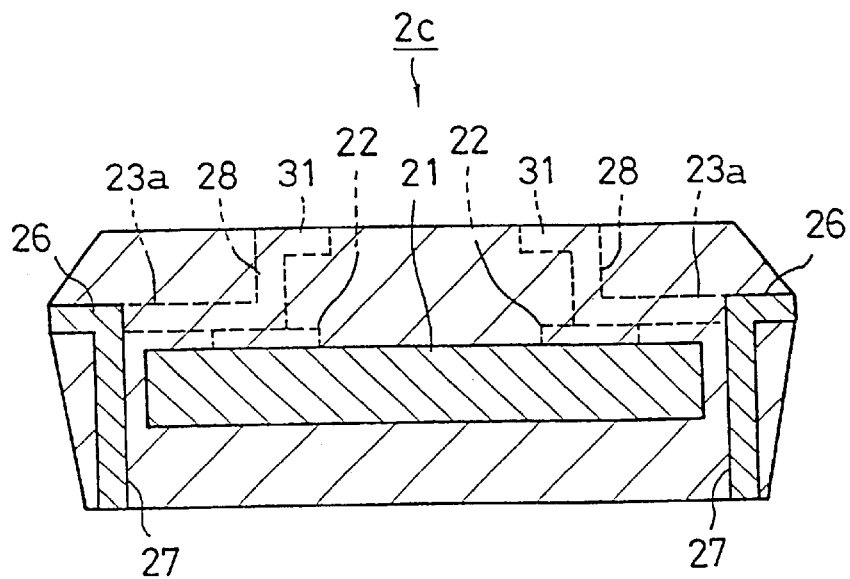
FIG. 9 is a cross section illustrating the internal structure of the semiconductor device in yet another example of a variation of the second embodiment of the present invention.

FIG. 9 is a cross section illustrating the internal structure of a semiconductor 2c in yet another example of a variation of the second embodiment of the present invention. It is to be noted that the position and the direction of the cross section are the same as those in FIG. 6. In this semiconductor 2c, a supporting piece 31, which is exposed parallel to the second front surface of the package 20 (the upper surface in the example illustrated in the figure) extends at the front end of each second bent portion 28 formed by fending an inner lead 23a within the package 20. It is to be also noted that since this semiconductor device 2c illustrated in FIG. 9 is structurally identical to the semiconductor device 2 explained earlier in reference to FIGS. 5 and 6, except for the supporting pieces 31 extending at the front ends of the second bent portions 28, the same reference numbers are assigned to components that are identical to those in the semiconductor 2 explained in reference to FIGS. 5 and 6 to preclude the necessity for repeated explanation thereof.

In the semiconductor device 2c having the supporting pieces 31 extending at the front ends of the second bent portions 28, the front surfaces of the supporting pieces 31 are firmly placed in tight contact with the inner surface of the forming die during the resin sealing process to achieve an increase in the contact area. Thus, the second bent portions 28 are held fast to the inner surface of the forming die during the resin sealing process so that the semiconductor element 21 is prevented from moving toward the second front surface of the package 20 (toward the upper surface in the FIG. illustrated in the figure) with a high degree of reliability.

Figure 10:
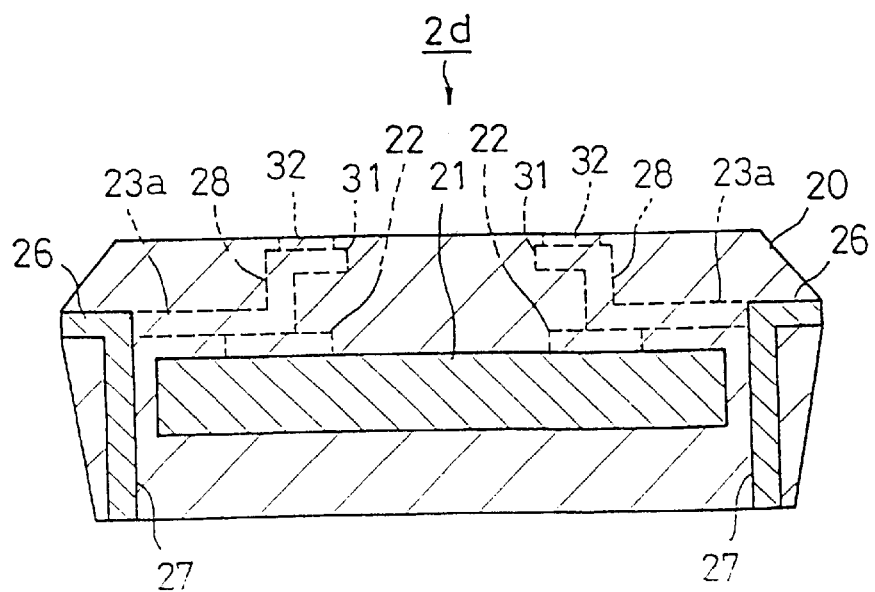
FIG. 10 is a cross section illustrating the internal structure of the semiconductor device in yet another example of a variation of the second embodiment of the present invention.

Furthermore, FIG. 10 is a cross section illustrating the internal structure of a semiconductor device 2d in yet another example of a variation of the second embodiment of the present invention. It is to be noted that the position and the direction of the cross section are the same as those in FIG. 6. In this semiconductor device 2d, a double-sided adhesive tape 32 constituted of a material having an insulating property such as polyimide is applied onto the front surfaces of the supporting pieces 31 which extend at the front ends of the second bent portions 28 as in the semiconductor device 2c explained earlier in reference to FIG. 9. It is to be noted that since the semiconductor device 2d illustrated in FIG. 10 has a structure identical to that of the semiconductor device 2 explained earlier in reference to FIGS. 5 and 6 except for the supporting pieces 31 having the double-sided adhesive tape 32 applied onto them, the same reference numbers are assigned to components in FIG. 10 that are structurally identical to those in the semiconductor device 2 explained earlier in reference to FIGS. 5 and 6 to preclude the necessity for repeated explanation thereof.

In this semiconductor device 2d having the double-sided adhesive tape 32 applied onto the supporting pieces 31, the front surfaces of the supporting pieces 31 are firmly bonded at the inner surface of the forming die with the double-sided adhesive tape 32 during the resin sealing process. Thus, an advantage is achieved in that the semiconductor element 21 is prevented from moving toward the second front surface of the package 20 (toward the upper surface in the example illustrated in the figure) with an even higher degree of reliability during the resin sealing process. In addition, by using a material with an insulating property such as polyimide to constitute the double-sided adhesive tape 32, an added advantage is achieved in that the front ends of the second bent portions 28 exposed at the front surface of the package 20 and the supporting pieces 31 can be insulated.

Figure 11:
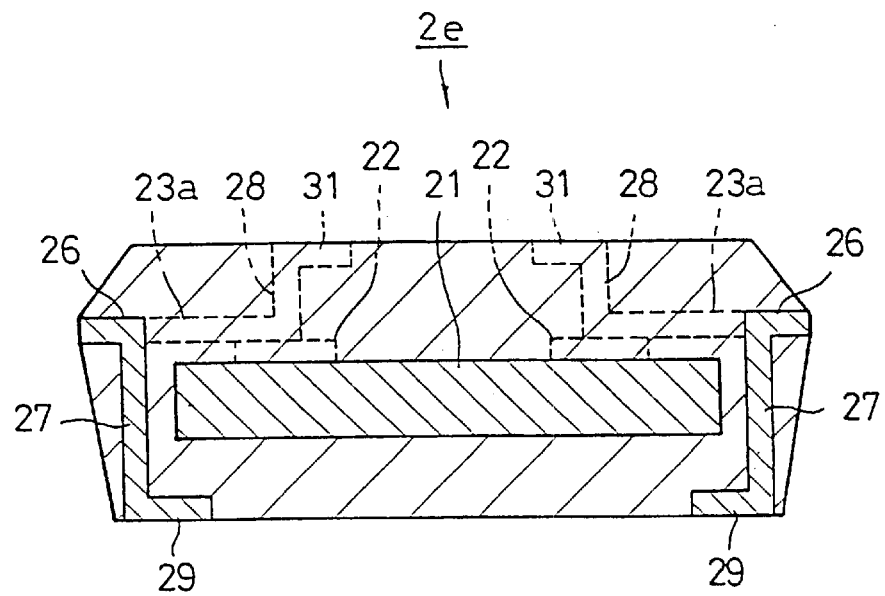
FIG. 11 is a cross section illustrating the internal structure of the semiconductor device in yet another example of a variation of the second embodiment of the present invention.

Furthermore, FIG. 11 is a cross section illustrating the internal structure of a semiconductor device 2e in yet another example of a variation of the second embodiment of the present invention. It is to be noted that the position and the direction of the cross section are the same as those in FIG. 6. In this semiconductor device 2e, a supporting piece 29 which is exposed parallel to the first surface of the package 20 (the lower surface in the example illustrated in the figure) extends at the front end of each bent portion 27, and a supporting piece 31 extends at the front end of the second bent portion 28 formed by bending an inner lead 23a within the package 20, exposed parallel to the second surface of the package 20 (the upper surface in the example illustrated in the figure). It is to be noted that since the semiconductor device 2e illustrated in FIG. 11 has a structure identical to that of the semiconductor device 2 explained earlier in reference to FIGS. 5 and 6 except for the supporting pieces 29 and 31 extending at the front ends of the bent portions, the same reference numbers are assigned to components in FIG. 11 that are structurally identical to those in the semiconductor device 2 explained earlier in reference to FIGS. 5 and 6 to preclude the necessity for repeated explanation thereof.

In this semiconductor device 2e, in which the supporting pieces 29 are provided extending at the front ends of the first bent portions 27 and the supporting pieces 31 are provided extending at the front ends of the second bent portions 28, the first surfaces of the supporting pieces 29 and 31 are firmly placed in tight contact with the inner surfaces of the forming die (the upper and lower surfaces) during the resin sealing process to increase the contact area. Thus, the first bent portions 27 and the second bent portions 28 are held fast to the inner surfaces of the forming die during the resin sealing process to achieve an advantage in that the semiconductor element 21 is prevented from moving toward the first front surface (toward the lower surface in the example illustrated in the figure) and toward the second front surface (toward the upper surface in the example illustrated in the figure) of the package 20, with a high degree of reliability.

Figure 12:
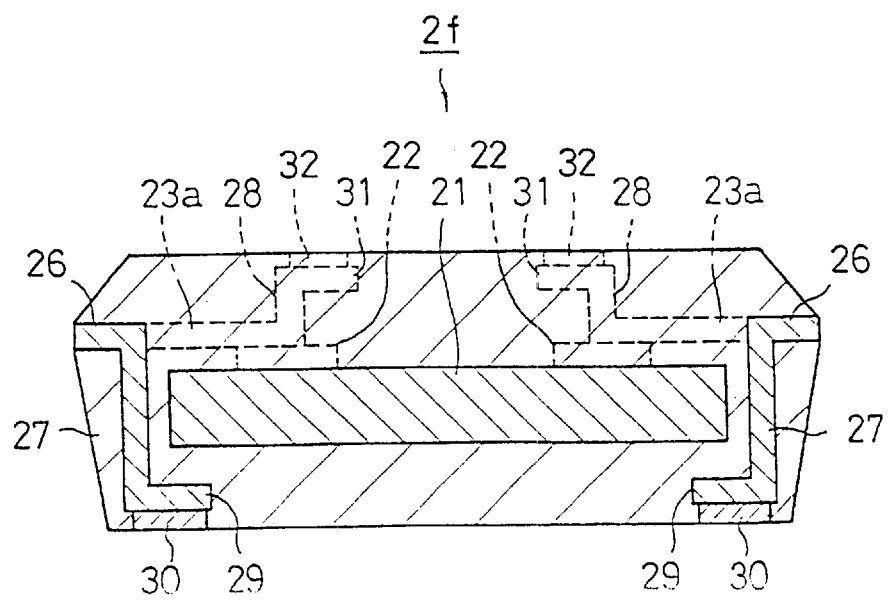
FIG. 12 is a cross section illustrating the internal structure of the semiconductor device in yet another example of a variation of the second embodiment of the present invention.

In addition, FIG. 12 is a cross section illustrating the internal structure of a semiconductor device 2f in yet another example of a variation of the second embodiment of the present invention. It is to be noted that the position and the direction of the cross section are the same as those in FIG. 6. In this semiconductor device 2f, double-sided adhesive tapes 30 and 32 constituted of a material having an insulating property such as polyimide are applied onto the front surfaces of the supporting pieces 29 which extend at the front ends of the first bent portions 27 and the first surfaces of the supporting pieces 31 extending at the front ends of the second bent portions 28 as in the semiconductor device 2e explained earlier in reference to FIG. 11. It is to be also noted that since the semiconductor device 2f illustrated in FIG. 12 has a structure identical to that of the semiconductor device 2 explained earlier in reference to FIGS. 5 and 6 except for the double-sided adhesive tapes 30 and 32 respectively applied onto the supporting pieces 29 and 31 the same reference numbers are assigned to components in FIG. 12 that are structurally identical to those in the semiconductor device 2 explained earlier in reference to FIGS. 5 and 6 to preclude the necessity for repeated explanation thereof.

In this semiconductor device 2f having the double-sided adhesive tapes 30 and 32 applied onto the supporting pieces 29 and 31, the front surfaces of the supporting pieces 29 and 31 are firmly bonded at the inner surface of the forming die with the double-sided adhesive tapes 30 and 32 respectively during the resin sealing process. Thus, an advantage is achieved in that the semiconductor element 21 is prevented from moving toward the first front surface (toward the lower surface in the example illustrated in the figure) or toward the second front surface (toward the upper surface in the example illustrated in the figure) of the package 20 with an even higher degree of reliability during the resin sealing process. In addition, by using a material with an insulating property such as polyimide to constitute the double-sided adhesive tapes 30 and 32, an added advantage is achieved in that the front ends of the first bent portions 27 and the front ends of the second bent portions 28 exposed at the front surface of the package 20 and the supporting pieces 29 and 31 can be insulated.

Figure 13:
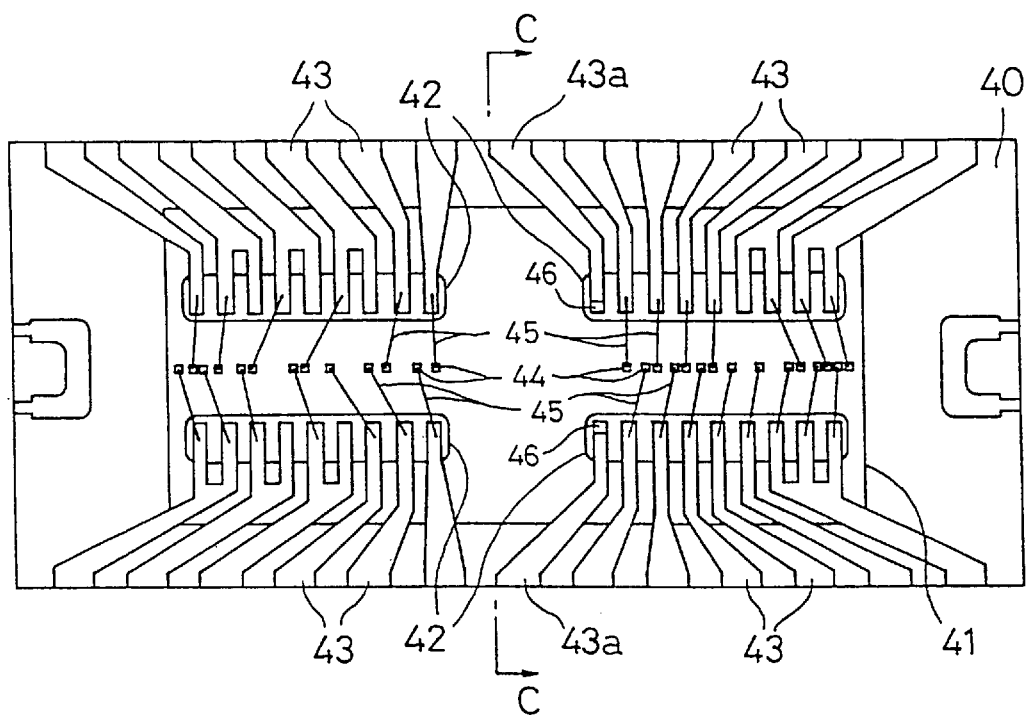
FIG. 13 is a plan view illustrating the inner structure of the semiconductor device in the third embodiment of the present invention.
Figure 14:
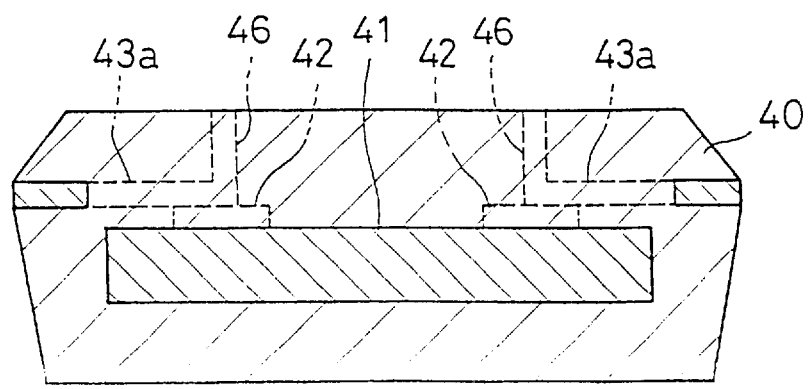
FIG. 14 is a cross section along line C—C in FIG. 13.

Next, FIG. 13 is a plan view illustrating the internal structure of a semiconductor device 3 in the third embodiment of the present invention and FIG. 14 is a cross section along line C—C in FIG. 13. As in the first and second embodiments of the present invention explained earlier, at a front surface of a semiconductor element (chip) 41 covered by a package 40, a plurality of inner leads 43 are bonded using a double-sided adhesive tape 42 constituted by using a material having an insulating property, such as polyimide. Except for some inner leads 43a, the inner leads 43 are each electrically connected with an electrode pad 44 provided at the front surface of the semiconductor element 41 via a wire 45 such as a metal wire. As in the case of the other inner leads 43, the inner leads 43a (non-connect pins), too, that are not electrically connected with an electrode pad 44, are bonded to the front surface of the semiconductor element 41 with the double-sided adhesive tape 42 at their base portions (the portions in the individual inner leads 43a that do not constitute bent portions 46, which are to be detailed later).

In the third embodiment, a bent portion 46 is formed by almost vertically bending upward each of the inner leads 43a located at approximately the center of the plurality of inner leads 43 that are not electrically connected with an electrode pad 44. As illustrated in FIG. 14, the front ends of the bent portions 46 formed by bending the inner leads 43a are exposed at a front surface of the package 40 (the upper surface in the example illustrated in the figure).

The semiconductor device 3 in the third embodiment, too, is manufactured in a manner identical to that for manufacturing a regular resin-sealed semiconductor device having the LOC structure. Namely, first, as illustrated in FIGS. 13 and 14, the inner leads 43 and 43a are bonded at the front surface of the semiconductor element 41 using the double-sided adhesive tape 42, and the semiconductor element 41 is placed at approximately the center within a forming die (not shown) with the individual inner leads 43 electrically connected to the electrode pads 44 via the wires 45. Then, by forcing a liquid resin into the forming die and hardening the resin, the semiconductor element 41 is internally mounted within the package 40.

During this manufacturing process, when resin sealing the assembly by forcing the liquid resin into the forming die, the pressure of the liquid resin or the like are bound to be applied to the semiconductor element 41. However, in the semiconductor device 3 in the third embodiment having the bent portions 46 each formed by almost vertically bending upward an inner lead 43a that is not electrically connected with an electrode pad 44 inside the package 40 with the front ends of the bent portions 46 exposed at the front surface of the package 40 (the upper surface in the example illustrated in the figure), as explained earlier in reference to FIGS. 13 and 14, the front ends of the bent portions 46 come into contact with the inner surface of the forming die (the upper surface of the forming die illustrated in the figure) when the semiconductor element 41 is placed inside the forming die.

Thus, even when the pressure of the liquid resin or the like is applied to the semiconductor element 41 during the resin sealing process, the semiconductor element 41 is prevented from moving toward the front surface of the package 40 by the bent portions 46 within the forming die. Consequently, the semiconductor device 3 in the third embodiment, in which the semiconductor element 41 can be internally mounted at the center of the package 40, is free of problems such as the wires 45 becoming exposed and forming defects that are attributable to misalignment of the semiconductor element 41.

In addition, in the semiconductor device 3 in the third embodiment, since the inner leads 43a having the bent portions 46 are not electrically connected with any of the electrode pads 44 at the front surface of the semiconductor element 41, the problem of an electrical signal erroneously input to the semiconductor element 41 through the front ends of the bent portions 46 exposed at the front surface of the package 40 is eliminated. Furthermore, as explained earlier, since the bent inner leads 43a, too, are bonded to the front surface of the semiconductor element 41 using the double-sided adhesive tape 42, the bent portions 46 can be firmly secured to the front surface of the semiconductor element 41 so that the front ends of the bent portions 46 can be firmly placed into contact with the inner surface of the forming die when the semiconductor element 41 is mounted inside the forming die.

Figure 15:
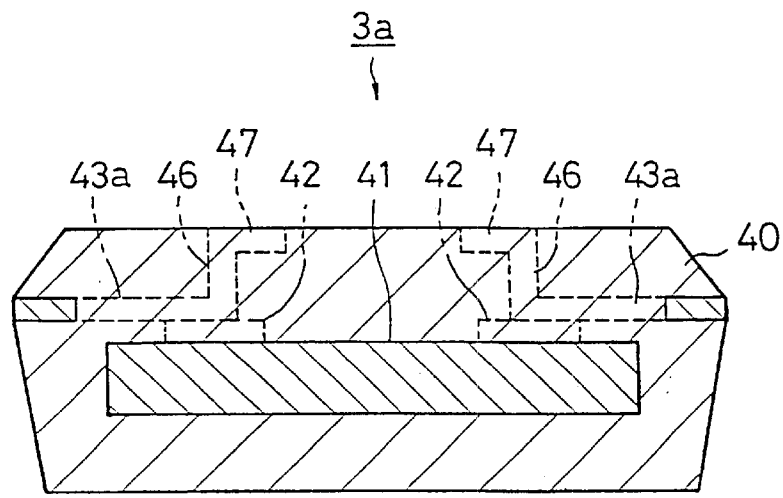
FIG. 15 is a cross section illustrating the internal structure of the semiconductor device in an example of a variation of the third embodiment of the present invention.

FIG. 15 is a cross section illustrating the internal structure of a semiconductor device 3a in an example of a variation of the third embodiment of the present invention. It is to be noted that the position and the direction of the cross section are the same as those in FIG. 14. In this semiconductor device 3a, supporting pieces 47, which is exposed parallel to the surface of the package 40 (the upper surface in the example illustrated in the figure) extends at the front end of each bent portion 46 formed by bending an inner lead 43a within the package 40. It is to be also noted that since the semiconductor device 3a illustrated in FIG. 15 has a structure identical to that of the semiconductor device 3 explained earlier in reference to FIGS. 13 and 14 except for the supporting pieces 47 extending at the front ends of the bent portions, the same reference numbers are assigned to components in FIG. 15 that are structurally identical to those in the semiconductor device 3 explained earlier in reference to FIGS. 13 and 14 to preclude the necessity for repeated explanation thereof.

In this semiconductor device 3a, in which the supporting pieces 47 are provided extending at the front ends of the bent portions 46, the front surfaces of the supporting pieces 47 are firmly placed in tight contact with the inner surface of the forming die during the resin sealing process to increase the contact area. Thus, the bent portions 46 are held fast to the inner surface of the forming die during the resin sealing process to achieve an advantage in that the semiconductor element 41 is prevented from moving toward the front surface of the package 40 (toward the upper surface in the example illustrated in the figure) with a high degree of reliability.

Figure 16:
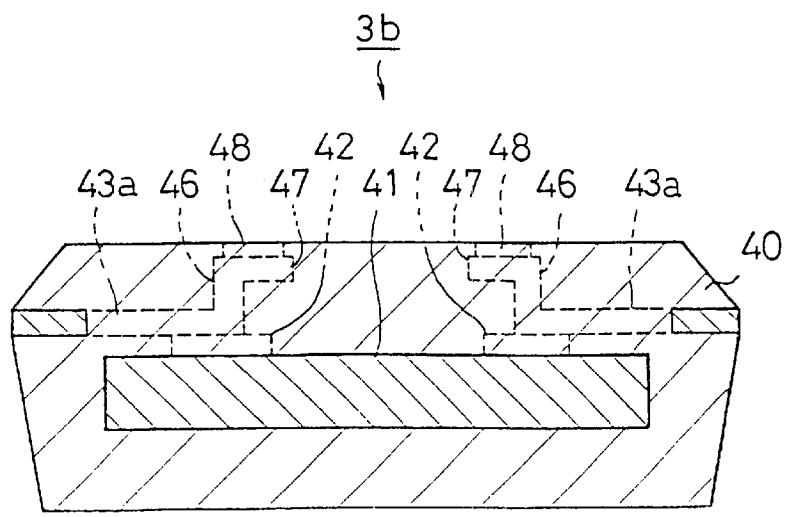
FIG. 16 is a cross section illustrating the internal structure of the semiconductor device in another example of a variation of the third embodiment of the present invention.
Figure 17:
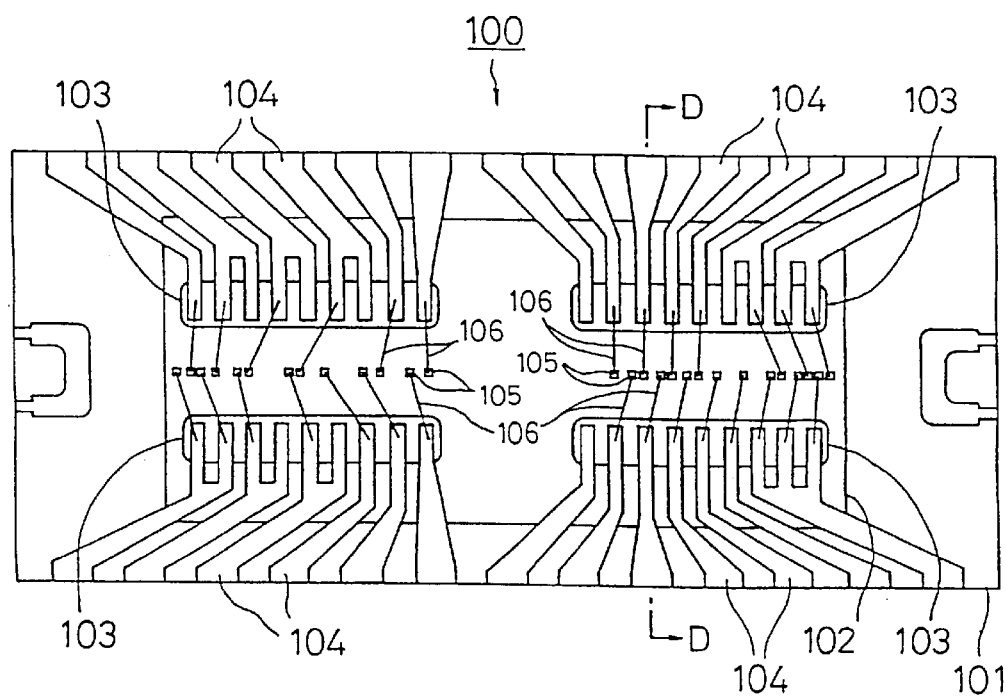
FIG. 17 is a plan view illustrating the internal structure of an LOC semiconductor device in the prior art.
Figure 18:
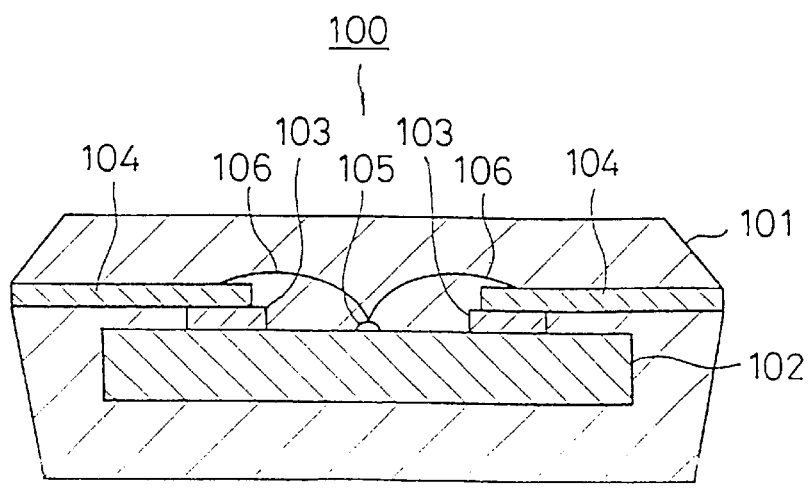
FIG. 18 is a cross section along line D—D in FIG. 17.

In addition, FIG. 16 is a cross section illustrating the internal structure of a semiconductor device 3b in an example of a variation of the third embodiment of the present invention. It is to be noted that the position and the direction are the same as those in FIG. 14. In this semiconductor device 3b, a double-sided adhesive tape 48 constituted of a material having an insulating property such as polyimide is applied onto the front surfaces of the supporting pieces 47 which extend at the front ends of the first bent portions 46 as in the semiconductor device 3a explained earlier in reference to FIG. 15. It is to be also noted that since the semiconductor device 3b illustrated in FIG. 16 has a structure identical to that of the semiconductor device 3 explained earlier in reference to FIGS. 13 and 14 except for the supporting pieces 47 having the double-sided adhesive tape 48 applied onto them, the same reference numbers are assigned to components in FIG. 16 that are structurally identical to those in the semiconductor device 3 explained earlier in reference to FIGS. 13 and 14 to preclude the necessity for repeated explanation thereof.

In the semiconductor device 3b having the double-sided adhesive tape 48 applied onto the supporting pieces 47, the front surfaces of the supporting pieces 47 are firmly bonded at the inner surface of the forming die with the double-sided adhesive tape 48 during the resin sealing process. Thus, an advantage is achieved in that the semiconductor element 41 is prevented from moving toward the front surface of the package 40 (toward the upper surface in the example illustrated in the figure) with an even higher degree of reliability during the resin sealing process. In addition, by using a material with an insulating property such as polyimide to constitute the double-sided adhesive tape 48, an added advantage is achieved in that the front ends of the bent portions 46 exposed at the front surface of the package 40 and the supporting pieces 47 can be insulated.

According to the present invention, a semiconductor device in which the semiconductor element is not caused to move vertically within the forming die by the pressure of the liquid resin or the like during the sealing process is provided. In addition, according to the present invention, exposure of wires and partial forming defects and the like that are attributable to misalignment of the semiconductor element (chip shift) can be prevented even in a semiconductor device with a small package thickness having the so-called TSOP structure and thus, concerns such as reduction in the moisture resistance are eliminated.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, the present invention may be adopted in the entire range of semiconductor devices including semiconductor devices with packages having die pat such as TSOP (Thin Small Outline Package) as well as semiconductor elements having the LOC structure.

In addition, a bent portion may be formed at any location at an inner lead in conformance to the design of a given semiconductor device. For instance, the bent portion may be formed at the side where the inner lead is connected to the semiconductor element or it may be formed on the opposite side. Alternatively, the bent portions may be formed in a roughly central area of the package or they may be positioned in a roughly peripheral area of the package.

Furthermore, while the bent portions are bent in a direction which is almost vertical to the direction in which the other inner leads extend in the embodiments explained above, they may be bent in any direction, as long as the bending direction is different from the direction in which the other inner leads extend.

The entire disclosure of Japanese Patent Application No. 10-38145 filed on Feb. 3, 1998, including specification, claims, drawings and summary is incorporated herein by reference in its entirety.

What is claimed is:

1. A semiconductor device comprising:

a semiconductor chip;

a plurality of electrode pads electrically connected to said semiconductor chip;

a first group of leads, wherein each lead of the first group of leads is connected to a corresponding electrode pad of said plurality of electrode pads, and has a first portion and a second portion, the first portion being attached to said semiconductor chip by an electrode pad;

said second portion having a second group of leads, wherein each lead of the second group of leads is attached to the semiconductor chip but is not connected to said electrode pads, and each lead of the second group of leads has a third portion, a fourth portion and a fifth portion, the third portion being attached to said semiconductor chip, the fourth portion extending almost parallel to the third portion and the fifth portion connecting the third portion and the fourth portion; and a package which covers said semiconductor chip, the first, third and fifth portions and exposes the second and fourth portions at a surface of said package.

2. A semiconductor device according to claim 1, wherein: said fifth portion is formed on a side of said semiconductor chip opposite from a side where connection to said semiconductor chip is achieved.

3. A semiconductor device according to claim 1, wherein: said fifth portion is formed at a side of said semiconductor chip where connection to said semiconductor chip is achieved.

4. A semiconductor device according to claim 1, wherein: said fifth portion is bent in a direction different from a direction in which said first group of leads extend.

5. A semiconductor device according to claim 1, wherein: said fifth portion is located in an approximate central area of said package.

6. A semiconductor device according to claim 1, wherein: said fifth portion is located in an approximate peripheral area of said package.

7. A semiconductor device according to claim 1, wherein: said plurality of electrode pads are arranged in the central portion of the package.

8. A semiconductor device according to claim 5, wherein: each lead of said second group of leads further includes a branch portion branched out therefrom.

9. A semiconductor device according to claim 1, wherein: said fourth portion extends almost parallel to said surface of said package.

10. A semiconductor device according to claim 1, further comprising:

a double-sided adhesive tape applied onto a front surface of said fourth portion.

11. A semiconductor device comprising:

a semiconductor chip;

a plurality of electrode pads electrically connected to said semiconductor chip;

a first group of leads, wherein each lead of the first group of leads is connected to a corresponding electrode pad of said plurality of electrode pads, and has a first portion and a second portion, the first portion being attached to said semiconductor chip by an electrode pad;

said second portion having a second group of leads, wherein each lead of the second group of leads is attached to said semiconductor chip but is not connected to said electrode pads, and each lead of the second group of leads has a third portion, a fourth portion, a fifth portion, a first bent portion and a second bent portion, the third portion being attached to said semiconductor chip, the fourth portion extending almost parallel to the third portion and the fifth portion connecting the third portion and the fourth portion; and a package which covers said semiconductor chip, the first, third and fifth portions, exposes the second portion and fourth portion at a surface of the package, exposes said first bent portions at a first surface of said package and exposes second bent portions at a second surface of said package.

12. A semiconductor device according to claim 11, wherein:

said bent portions are formed on a side of said semiconductor chip opposite from a side where connection to said semiconductor chip is achieved.

13. A semiconductor device according to claim 11, wherein: said bent portions are formed at a side of said semiconductor chip where connection to said semiconductor chip is achieved.

14. A semiconductor device according to claim 11, wherein:

at least either said first bent portions or said second bent portions are bent in a direction different from a direction in which said first group of the inner leads extend.

15. A semiconductor device according to claim 11, wherein:

at least either said first bent portions or said second bent portions are located in an approximate central area of said package.

16. A semiconductor device according to claim 11, wherein:

at least either said first bent portion or said second bent portions are located in an approximate peripheral area of said package.

17. A semiconductor device according to claim 11, wherein:

said first bent portions and said second bent portions are constituted as integrated units.

18. A semiconductor device according to claim 11, wherein:

said plurality of electrode pads are arranged in the central portion of the package.

19. A semiconductor device according to claim 11, wherein:

at least either said first bent portions or said second bent portions are each formed by branching out from the second group of the inner leads.

20. A semiconductor device according to claim 11, wherein:

a base portion of an inner lead at which at least either said first bent portions or said second bent portions are formed is bonded to a corresponding surface of said semiconductor chip.

21. A semiconductor device according to claim 11, wherein:

a supporting piece is provided extending at a front end of each of said first bent portions, exposed parallel to the first surface of said package.

22. A semiconductor device according to claim 21, wherein:

a double-sided adhesive tape is applied onto a front surface of said supporting piece.

23. A semiconductor device according to claim 11, further comprising:

a supporting piece is provided extending at a front end of each of said second bent portions, exposed parallel to the second surface of said package.

24. A semiconductor device according to claim 23, wherein:

a double-sided adhesive tape is applied onto a front surface of said supporting piece.

* * * * *